(12) United States Patent
Kai

(10) Patent No.: US 9,111,825 B2
(45) Date of Patent: Aug. 18, 2015

(54) IMAGE SENSOR, LIGHT QUANTITY MEASUREMENT METHOD, AND MICROSCOPE SYSTEM

(75) Inventor: Shinichi Kai, Tokyo (JP)

(73) Assignee: Sony Corporation, Tokyo (JP)

( * ) Notice: Subject to any disclaimer, the term of this patent is extended or adjusted under 35 U.S.C. 154(b) by 139 days.

(21) Appl. No.: 13/592,429

(22) Filed: Aug. 23, 2012

(65) Prior Publication Data

US 2013/0056616 A1 Mar. 7, 2013

(30) Foreign Application Priority Data

Sep. 1, 2011 (JP) .................................. 2011-190381

(51) Int. Cl.
*H01L 27/146* (2006.01)

(52) U.S. Cl.
CPC .... *H01L 27/14603* (2013.01); *H01L 27/14623* (2013.01)

(58) Field of Classification Search
USPC ..................... 250/208.1, 214.1, 216, 214 R; 348/243–245, 294
See application file for complete search history.

(56) References Cited

U.S. PATENT DOCUMENTS 7,345,814 B2 * 3/2008 Yoneyama et al. ........... 359/383
8,227,734 B2 * 7/2012 Kameda ..................... 250/208.1

FOREIGN PATENT DOCUMENTS

JP 2007-300179 11/2007

* cited by examiner

*Primary Examiner* — Tony Ko
(74) *Attorney, Agent, or Firm* — Sony Corporation

(57) ABSTRACT

An image sensor includes an effective pixel region formed of a pixel group which is irradiated with light, and an optical black region formed of a pixel group which is shielded from light. In the image sensor, when the image sensor is used for a light quantity measurement, the effective pixel region is sectioned into a measurement region used for the light quantity measurement and a light shielding region which is used for a calculation of a value of one of an offset component and a noise component and is shielded from light.

10 Claims, 11 Drawing Sheets

IMAGE SENSOR, LIGHT QUANTITY MEASUREMENT METHOD, AND MICROSCOPE SYSTEM

BACKGROUND

The present disclosure relates to an image sensor, a light quantity measurement method, and a microscope system, and in particular to an image sensor, a light quantity measurement method, and a microscope system which are capable of measuring a quantity of light with which pixels are irradiated irrespective of an arrangement position on a light receiving surface with desirable accuracy.

An image sensor such as a CMOS (Complementary Metal Oxide Semiconductor) and a CCD (Charge Coupled Device) has a light receiving surface constituted of a plurality of pixel groups and is used to measure a light quantity in some cases in addition to a typical usage of taking an image.

On the light receiving surface of the image sensor, there are an effective pixel region formed of a pixel group which is irradiated with light and an optical black region formed of a pixel group which is shielded from light. In the image sensor used for a light quantity measurement, an output value of a pixel in the optical black region is subtracted from an output value of a pixel in the effective pixel region, thereby removing a noise or an offset of the output value of the pixel due to heat or a circuit structure (see, Japanese Patent Application Laid-open No. 2007-300179).

SUMMARY

However, the amount of the noise or offset of the output value of the pixel varies depending on a temperature. Therefore, in the case where a temperature distribution exists on the light receiving surface of the image sensor, a variation of noises or offsets of output values of pixels is caused depending on the temperature distribution. Accordingly, in the case where the position of a pixel used for the measurement is close to the optical black region, there is almost no difference in the amount of the noise or offset between the pixel used for the measurement and the pixel in the optical black region, with the result that it is possible to measure the quantity of light, with which the pixel used for the measurement is irradiated, with certain accuracy. In contrast, in the case where the position of the pixel used for the measurement is distanced from the optical black region, there is a large difference in the amount of the noise or offset between the pixel used for the measurement and the pixel in the optical black region, with the result that it may be difficult to measure the quantity of light, with which the pixel used for the measurement is irradiated, with desirable accuracy.

In view of the above-mentioned circumstances, it is desirable to make it possible to measure the quantity of light, with which the pixels are irradiated, with desirable accuracy irrespective of the arrangement position on the light receiving surface.

According to a first embodiment of the present disclosure, there is provided an image sensor including an effective pixel region formed of a pixel group which is irradiated with light and an optical black region formed of a pixel group which is shielded from light, in which when the image sensor is used for a light quantity measurement, the effective pixel region is sectioned into a measurement region used for the light quantity measurement and a light shielding region which is used for a calculation of a value of one of an offset component and a noise component and is shielded from light.

The light shielding region can be disposed on the basis of a direction in which a temperature gradient appears in the image sensor.

When the temperature gradient appears in a column direction of the image sensor, two light shielding regions can be disposed with the measurement region sandwiched therebetween in the column direction. When the temperature gradient appears in a row direction of the image sensor, two light shielding regions can be disposed with the measurement region sandwiched therebetween in the row direction.

When the temperature gradient appears in a two-dimensional direction of the image sensor, two light shielding regions can be disposed with the measurement region sandwiched therebetween in the column direction, and two light shielding regions can be disposed with the measurement region sandwiched therebetween in the row direction.

The effective pixel region can be sectioned into a plurality of measurement regions.

According to a second embodiment of the present disclosure, there is provided a light quantity measurement method of an apparatus configured to measure a light quantity by using an image sensor including an effective pixel region formed of a pixel group which is irradiated with light, and an optical black region formed of a pixel group which is shielded from light, in which when the image sensor is used for a light quantity measurement, the effective pixel region is sectioned into a measurement region used for the light quantity measurement and a light shielding region which is used for a calculation of a value of one of an offset component and a noise component and is shielded from light. The light quantity measurement method includes obtaining output values of pixels of the measurement region by the apparatus, calculating the value of the one of the offset component and the noise component by the apparatus on the basis of the obtained output values of the pixels of the light shielding region, subtracting the calculated value of the one of the offset component and the noise component from the obtained output values of the pixels of the measurement region by the apparatus, and outputting, as the light quantity, a value obtained by the subtracting by the apparatus.

According to a third embodiment of the present disclosure, there is provided a microscope system including an image pickup apparatus, a microscope, and an information processing apparatus. The image pickup apparatus has an image sensor including an effective pixel region formed of a pixel group which is irradiated with light and an optical black region formed of a pixel group which is shielded from light, in which when the image sensor is used for a light quantity measurement, the effective pixel region is sectioned into a measurement region used for the light quantity measurement and a light shielding region which is used for a calculation of a value of one of an offset component and a noise component and is shielded from light. The microscope is connected to the image pickup apparatus and has a stage on which a sample is placed and an optical system configured to form an enlarged image of the sample on the image sensor. The information processing apparatus is configured to calculate a light quantity from an output of the image pickup apparatus.

As described above, according to the present disclosure, it is possible to measure the quantity of light, with which the pixels are irradiated, with desirable accuracy irrespective of the arrangement position on the light receiving surface.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure will be described with reference to the drawings.

(Structural Example of Microscope System)

Figure 1:
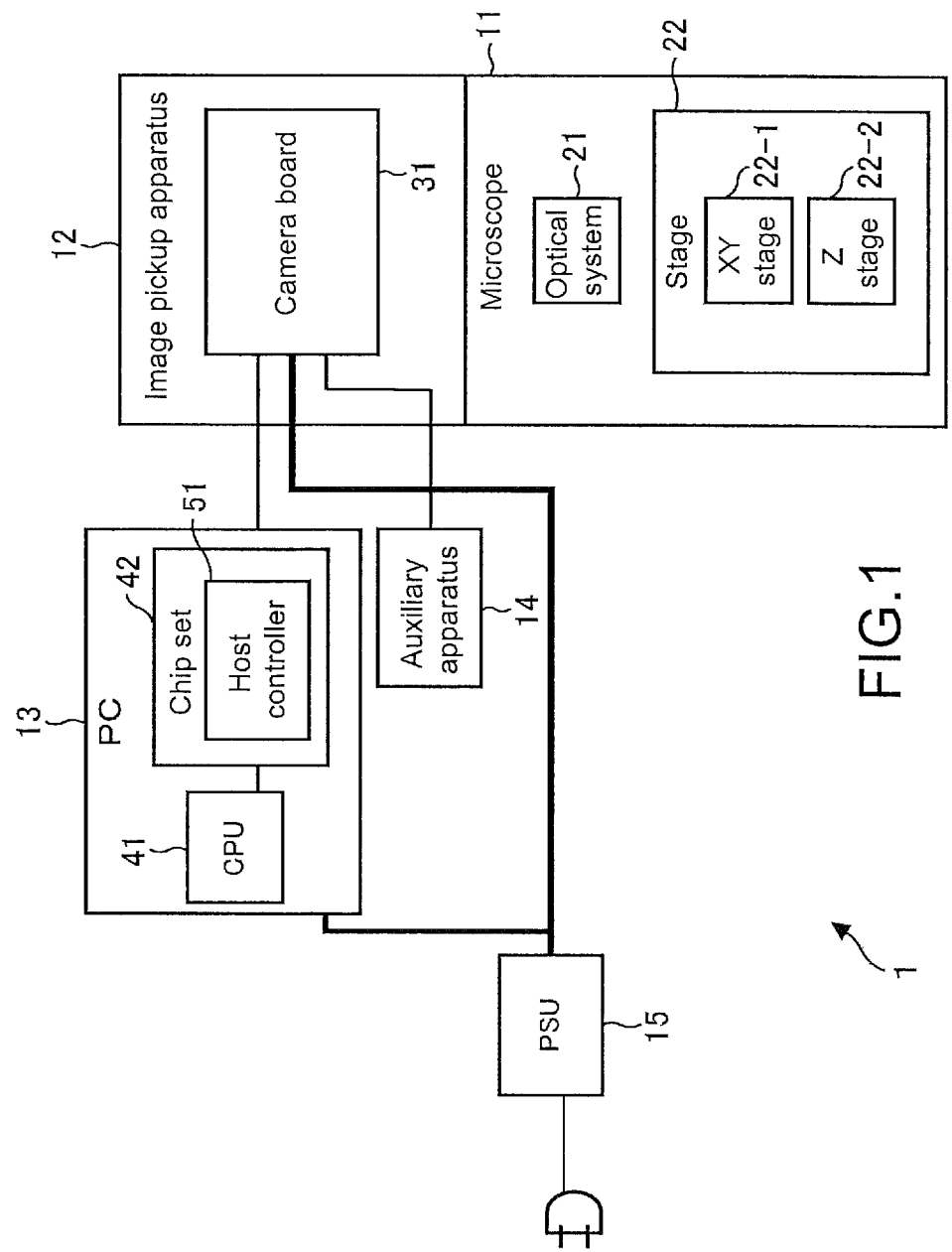
FIG. 1 is a diagram showing a structural example of a microscope system.

FIG. 1 is a diagram showing a structural example of a microscope system 1 to which the present disclosure is applied.

The microscope system 1 is constituted of a microscope 11, an image pickup apparatus 12, a PC (Personal Computer) 13, an auxiliary apparatus 14, and a PSU (Power Supply Unit) 15.

The microscope 11 has an optical system 21 for forming an enlarged image of a sample as an observation target on the retina of an observer or on an image sensor of the image pickup apparatus 12, for example, and a stage 22 on which the sample is placed. The stage 22 is constituted of an XY stage 22-1 and a Z stage 22-2. By control of a CPU (Central Processing Unit) 41 of the PC 13 or by an operation of a handle (not shown) by the observer, the XY stage 22-1 is moved in parallel to an XY plane (for example, horizontal plane) relative to the optical system 21. With this structure, the sample placed on the stage 22 is also moved in parallel to the XY plane. Further, by the control of the CPU 41 of the PC 13 or by the operation of the handle (not shown) by the observer, the Z stage 22-2 is moved in parallel to a Z axis direction (for example, vertical direction) relative to the optical system 21. With this structure, the sample placed on the stage 22 is also moved in parallel to the Z axis direction.

That is, the observer can visually confirm the enlarged image of the sample placed on the stage 22 through the optical system 21. In this case, to focus the enlarged image of the sample on the retina of the observer, the observer operates the PC 13 or the handle (not shown) to move the XY stage 22-1 or the Z stage 22-2, thereby moving a disposed position of the sample relative to the optical system 21 to an arbitrary position in a three-dimensional space.

Further, for example, if the image pickup apparatus 12 is equipped to the microscope 11, the image pickup apparatus 12 can take the enlarged image of the sample placed on the stage 22 through the optical system 21.

The image pickup apparatus 12 has a camera board 31, on which a circuit board on which an image sensor (image sensor 61 shown in FIG. 2) to be described later is mounted is formed as a part thereof or attached. The camera board 31 performs an operation of taking the enlarged image of the sample placed on the stage 22 through the optical system 21 by remote control with the PC 13. In this case, signals as triggers for various operations of the camera board 31 are supplied from the auxiliary apparatus 14.

The PC 13 includes the CPU 41 and a chip set 42. The CPU 41 controls overall operations of the PC 13. The chip set 42 is formed of a chip group for executing various processes under the control by the CPU 41, and has a host controller 51 as one of such chips. The host controller 51 performs remote control of an apparatus which is USB (Universal Serial Bus)-connected thereto. Here, the host controller 51 performs the remote control of the USB-connected camera board 31, thereby taking the enlarged image of the sample as described above.

The PSU (Power Supply Unit) 15 supplies electric power to respective portions that constitute the microscope system 1, for example, to the PC 13 or the camera board 31.

(Structural Example of Image Sensor as Base)

As described above, on the camera board 31, the circuit board on which the image sensor is mounted is formed as a part thereof or attached. In the case where the image sensor mounted on the circuit board is used for the light quantity measurement, it is necessary to measure the quantity of light, with which the pixel is irradiated, with desirable accuracy irrespective of the arrangement position in the effective pixel region.

Therefore, first, the inventors of the present disclosure studied a measurement of the quantity of light, with which the pixel in the effective pixel region is irradiated, by using a typical image sensor.

Figure 2:
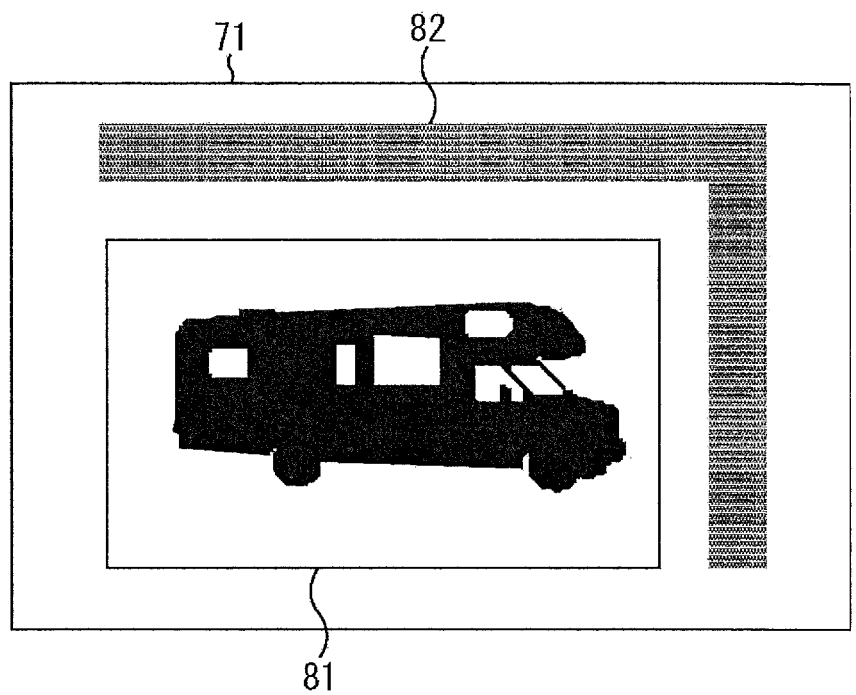
FIG. 2 is a top view showing the structure of an image sensor.

FIG. 2 is a top view showing the structure of the image sensor.

On a light receiving surface 71 of the image sensor 61, an effective pixel region 81 and an optical black region 82 are formed.

The effective pixel region 81 is a rectangular region formed of a pixel group which is irradiated with light, and is disposed substantially on a center portion of the light receiving surface 71 in the example of FIG. 2.

The optical black region 82 is an L-letter shaped region formed of a pixel group which is covered with a light shielding film made of aluminum or the like, and is disposed on a position apart from the effective pixel region 81 by a certain distance.

An output value of the optical black region 82 which is shielded from light is used as a reference value at a black level of an image in the case where the image sensor 61 is used to take an image (for example, used as a digital camera or the like). That is, pixel values that constitute image data are often determined by subtracting an average value (reference value of the black level) of output values of the optical black region 82 uniformly from the output values of the pixels that constitute the effective pixel region 81.

In contrast, in the case where the image sensor 61 is used to measure the light quantity, the output value of the optical black region 82 is used as a value of an offset or noise component. That is, a part of the pixels of the effective pixel region 81 is used to measure the light quantity, and the output value (value of the offset or noise component) of the pixel of the optical black region 82 is subtracted from the output value of the part of the pixels, thereby measuring the light quantity from which the offset or noise of the output value of the pixel is removed.

The case where a region of the part of the effective pixel region 81 is used for the light quantity measurement includes the case where an imaging optical system such as a lens is used to form an image of a subject on the image sensor 61 and the case where an object to be measured such as a light source is disposed closely to the image sensor 61 without using the imaging optical system such as the lens. In the following, the region of the part of the effective pixel region 81 which is used for the light quantity measurement is referred to as an ROI (Region Of Interest).

Figure 3:
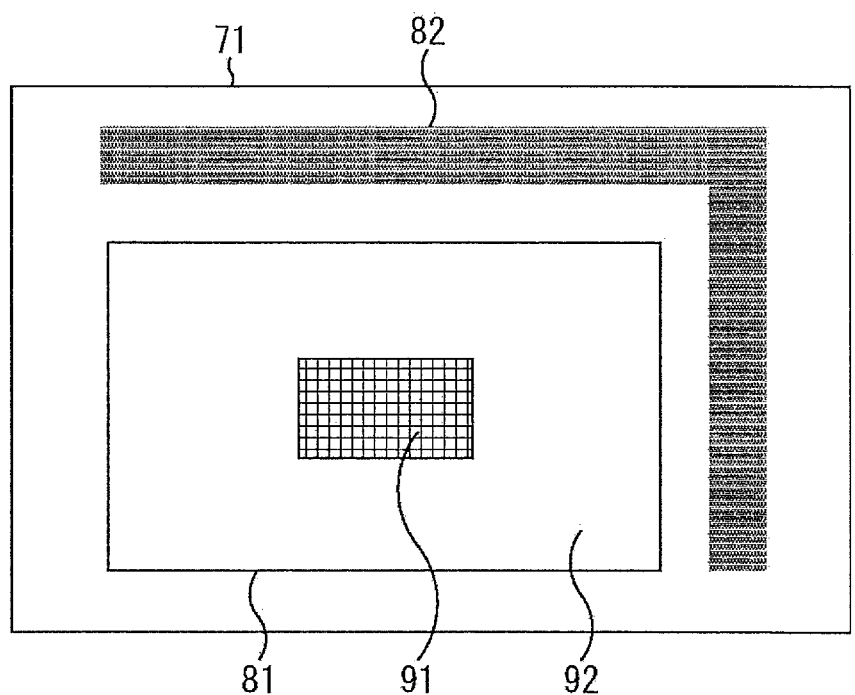
FIG. 3 is a top view showing the structure of a light receiving surface of the image sensor having an ROI.

FIG. 3 is a top view showing the structure of the light receiving surface of the image sensor having the ROI.

As shown in FIG. 3, an ROI 91 is a partial region in the effective pixel region 81. In the case of FIG. 3, the ROI 91 is disposed substantially on the center portion of the effective pixel region 81.

Here, focusing on a region 92 of the effective pixel region 81, which is a region excluding the ROI 91 from the effective pixel region 81, the region 92 is closer to the ROI 91 than the optical black region 82, so in the case where the temperature distribution exists on the light receiving surface 71 of the image sensor 61, temperatures of the pixels in the region 92 are closer to temperatures of pixels in the ROI 91 than temperatures of the pixels in the optical black region 82. Therefore, an offset or noise of an output value of each pixel in the region 92 is closer to an offset or noise of an output value of each pixel in the ROI 91 than the offset or noise of the output value of each pixel in the optical black region 82.

In view of this, the inventors of the present invention focus attention on the fact that the region 92 in the effective pixel region 81, which is the region excluding the ROI 91 from the effective pixel region 81, is not used for the light quantity measurement, and develop a method of performing light shielding of the region 92 and using the output value of each pixel in the region 92 as a value of an offset or noise component. Such a method is referred to as a method of the present disclosure. By employing the method of the present disclosure, it is possible to measure the quantity of light with which the pixels in the ROI 91 are irradiated with desirable accuracy irrespective of the arrangement position of the ROI 91.

(Structural Example of Light Receiving Surface of Image Sensor of Present Disclosure)

Figure 4:
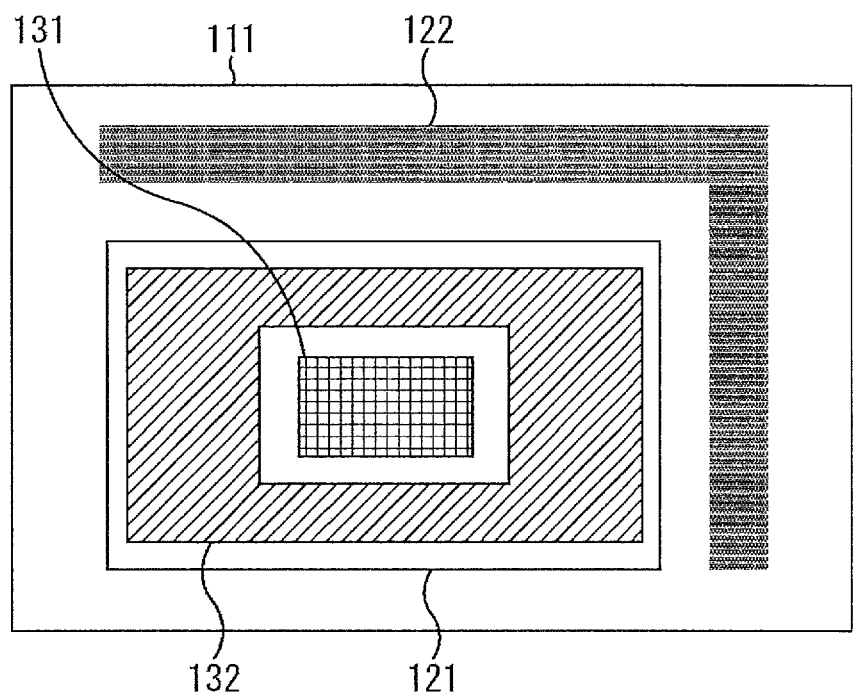
FIG. 4 is a top view showing a structural example of a light receiving surface of the image sensor to which a method of the present disclosure is applied.

FIG. 4 is a top view showing a structural example of a light receiving surface of an image sensor to which the method of the present disclosure is applied.

On a light receiving surface 111 of the image sensor 101, an effective pixel region 121 and an optical black region 122 are formed. On the effective pixel region 121, an ROI 131 and a light shielding region 132 are formed.

The effective pixel region 121 is a rectangular region formed of a pixel group which is irradiated with light, and is disposed substantially on the center portion of the light receiving surface 111 in the example of FIG. 4.

The optical black region 122 is an L-letter shaped region formed of a pixel group covered with a light shielding film made of aluminum or the like, and is disposed on a position which is set apart from the effective pixel region 121 by a certain distance.

The ROI 131 is a rectangular region used for the light quantity measurement, and is disposed substantially on the center portion of the effective pixel region 121 in the example of FIG. 4.

The light shielding region 132 is a region excluding the ROI 131 from the effective pixel region 121, and is shielded from light. The method of light shielding with respect to the light shielding region 132 is not limited in particular. For example, in the case where a cover glass (not shown) is attached to the image sensor 101, a light shielding film made of aluminum or the like is attached to the cover glass, with the result that the light shielding region 132 may be shielded from light. Further, for example, by bringing a non-transparent member (chip or the like) made of metal or the like into contact with the cover glass, the light shielding region 132 may be shielded from light. Furthermore, for example, a liquid crystal shutter is disposed on the cover glass, and a light transmittance is changed by the liquid crystal shutter, with the result that the light shielding region 132 may be shielded from light. On the other hand, in the case where the cover glass is not attached to the image sensor 101, by attaching a light shielding film made of aluminum or the like to the light shielding region 132 or by bringing the non-transparent member into contact with the light shielding region 132, the light shielding region 132 may be shielded from light.

The cover glass of the image sensor 101 or the light shielding region 132 is equipped with the light shielding film, with the result that the light shielding region 132 can be shielded from light permanently. Meanwhile, by changing a position where the non-transparent member is brought into contact or changing a position which is shielded from light by the liquid crystal shutter, it is possible to perform light shielding of the light shielding region 132 temporarily (i.e., at a time of light quantity measurement).

As shown in FIG. 4, because the light shielding region 132 is closer to the ROI 131 than the optical black region 122, in the case where a temperature distribution exists on the light receiving surface 111 of the image sensor 101, the temperatures of the pixels in the light shielding region 132 are closer to the temperatures of the pixels in the ROI 131 than the temperatures of the pixels in the optical black region 122. Therefore, the offset or noise of the output value of each pixel in the light shielding region 132 is closer to the offset or noise of the output value of each pixel in the ROI 131 than the offset or noise of the output value of each pixel in the optical black region 122.

In view of this, the quantity of light with which the ROI 131 is irradiated is obtained by subtracting an offset or noise component value calculated on the basis of the output values of the pixels of the light shielding region 132 from the output values of the pixels in the ROI 131. In this way, by appropriately removing the offset or noise, the quantity of light with which the ROI 131 is irradiated is measured with desirable accuracy. Here, as a calculation method of the offset or noise component value, any method can be used, as long as a method of using an output value of at least a part of the pixels of the light shielding region 132 is employed. For example, in this example, such a method that an average value of the pixels of the light shielding region 132 is calculated as an offset or noise component value is employed.

(Functional Structural Example of CPU)

Figure 5:
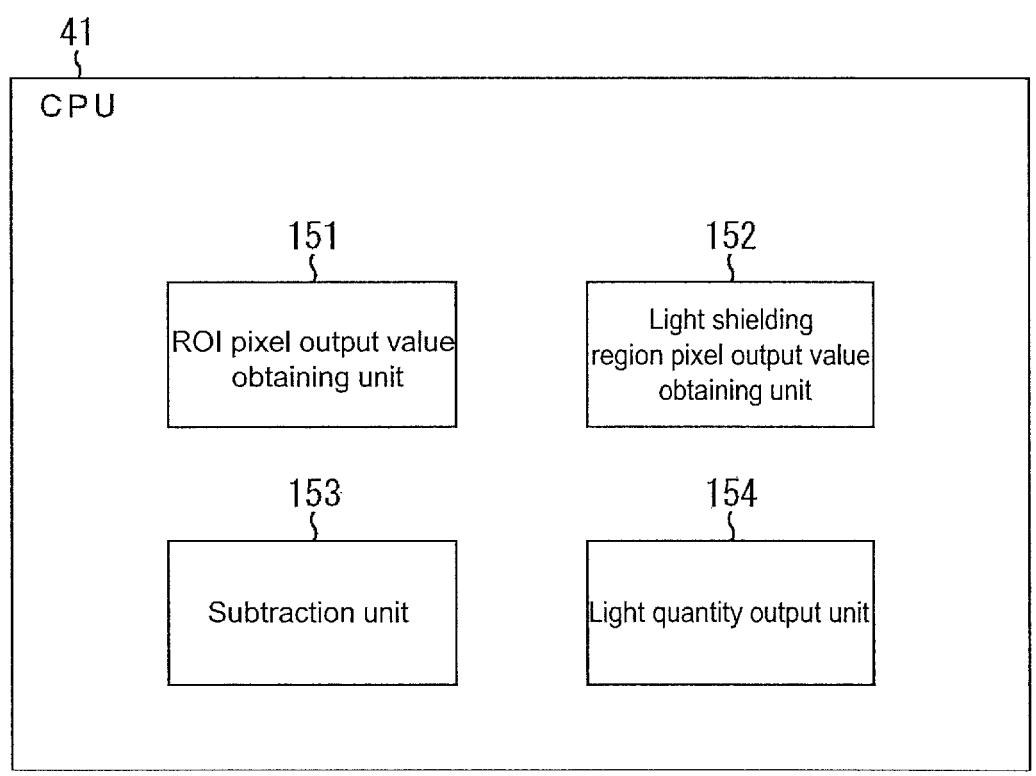
FIG. 5 is a block diagram showing a functional structural example of a CPU.

FIG. 5 is a block diagram showing a functional structural example for attaining various functions for measuring the quantity of light with which the ROI 131 is irradiated, out of functions of the CPU 41 shown in FIG. 1.

The CPU 41 has an ROI pixel output value obtaining unit 151, a light shielding region pixel output value obtaining unit 152, a subtraction unit 153, and a light quantity output unit 154.

The ROI pixel output value obtaining unit 151 obtains the output values of the pixels of the ROI 131.

The light shielding region pixel output value obtaining unit 152 obtains the output values of the pixels of the light shielding region 132, and calculates the offset or noise component value on the basis of the output values obtained. In this case, the light shielding region pixel output value obtaining unit 152 calculates an average value of the output values of the pixels of the light shielding region 132 as the offset or noise component value.

The subtraction unit 153 subtracts the offset or noise component value calculated by the light shielding region pixel output value obtaining unit 152 from the output values of the pixels of the ROI 131, which are obtained by the ROI pixel output value obtaining unit 151. As a result, the quantity of light with which the ROI 131 is irradiated is calculated.

The light quantity output unit 154 outputs the quantity of light with which the pixels of the ROI 131 are irradiated, which is calculated by the subtraction unit 153.

Next, a process performed by the CPU 41 (hereinafter, referred to as light quantity measurement process) will be explained.

(Light Quantity Measurement Process)

Figure 6:
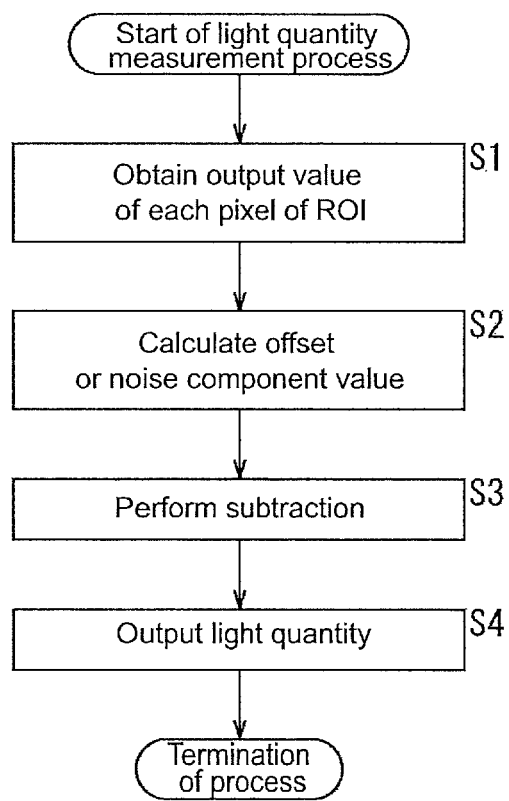
FIG. 6 is a flowchart explaining a flow of a light quantity measurement process.

FIG. 6 is a flowchart explaining a flow of the light quantity measurement process.

In Step S1, the ROI pixel output value obtaining unit 151 obtains the output values of the pixels of the ROI 131.

In Step S2, the light shielding region pixel output value obtaining unit 152 calculates the offset or noise component value on the basis of the output values of the pixels of the light shielding region 132.

In Step S3, the subtraction unit 153 subtracts the offset or noise component value calculated in Step S2 from the output values of the pixels of the ROI 131 which are obtained in Step S1. As a result, the quantity of light with which the ROI 131 is irradiated is calculated.

In Step S4, the light quantity output unit 154 outputs the quantity of light with which the ROI 131 is irradiated, which is calculated in Step S3.

Thus, the light quantity measurement process is terminated.

As described above, in the effective pixel region 121, the region which is not used for the light quantity measurement is shielded from light to obtain the light shielding region 132, and the output values of the pixels in the light shielding region 132 are used as the offset or noise component value of the ROI 131. As a result, even in the case where a temperature distribution exists on the light receiving surface 111 of the image sensor 101, it is possible to measure the quantity of light with which the pixels of the ROI 131 are irradiated with desirable accuracy.

(Another Example of Arrangement of ROI)

Figure 7:
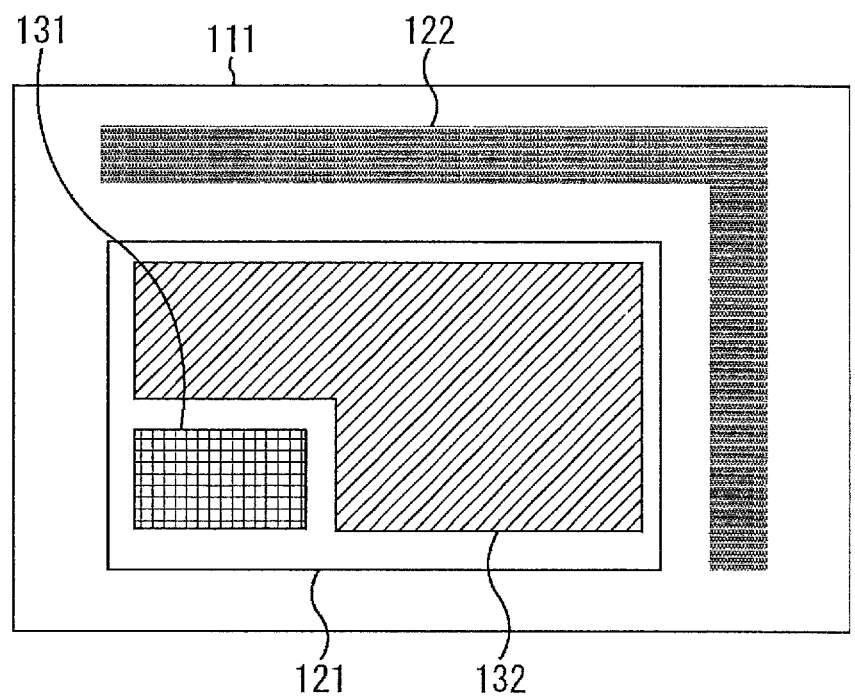
FIG. 7 is a top view showing a structural example of the light receiving surface of the image sensor on which the ROI is disposed on a different position.

In the example described above, the ROI 131 is arranged substantially on the center portion of the effective pixel region 121. However, the arrangement position of the ROI 131 is not limited thereto. For example, as shown in FIG. 7, the ROI 131 may be arranged on an end of the effective pixel region 121, and the arrangement position thereof only has to be within the effective pixel region 121.

Further, in the example described above, only one ROI 131 is arranged in the effective pixel region 121. However, the number of ROIs 131 arranged in the effective pixel region 121 is not limited thereto.

Figure 8:
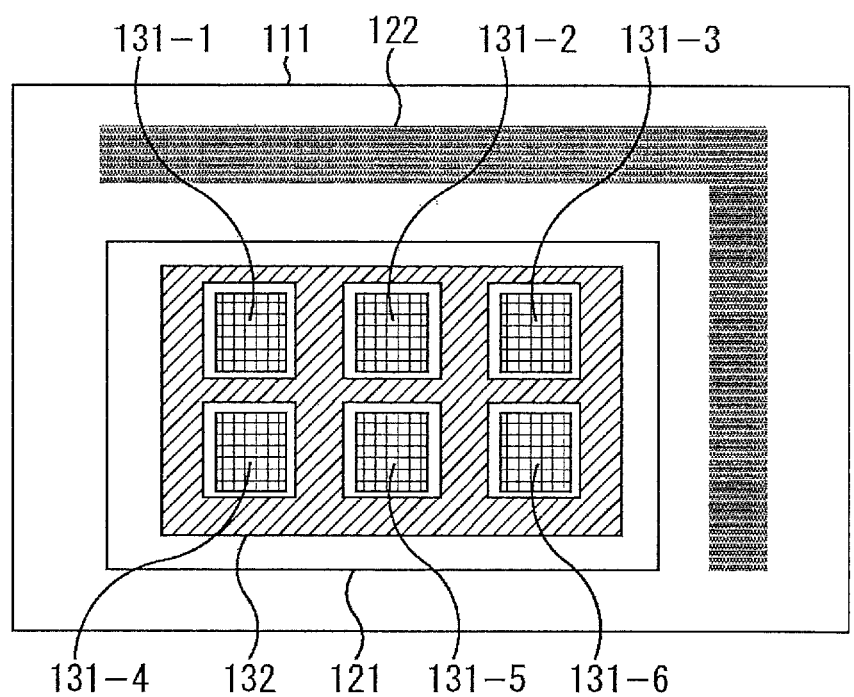
FIG. 8 is a top view showing a structural example of the light receiving surface of the image sensor on which a plurality of ROIs are arranged.

FIG. 8 is a top view showing a structural example of the light receiving surface 111 of the image sensor 101 on which a plurality of ROIs 131 are arranged.

In the example of FIG. 8, in the effective pixel region 121, ROIs 131-1 to 131-6 are arranged. In this case, in the effective pixel region 121, a region excluding the ROIs 131-1 to 131-6 is shielded from light and set as the light shielding region 132.

The number of ROIs 131 is increased, and the light shielding region 132 is provided among the plurality of ROIs 131, thereby making a distance between the ROIs 131 and the light shielding region 132 shorter. Therefore, even in the case where the temperature distribution exists on the light receiving surface 111 of the image sensor 101, it is possible to measure the quantity of light with which the ROIs 131 are irradiated with more desirable accuracy.

In the example described above, the quantity of light with which the ROIs 131 are irradiated is measured by subtracting the average value of the output values of the pixels of the light shielding region 132 from the output values of the pixels of the ROIs 131. However, the quantity of light with which the ROIs 131 are irradiated may be measured with the use of output values of pixels of a partial area (hereinafter, referred to as correction region) of the light shielding region 132.

(Correction Region)

Figure 9:
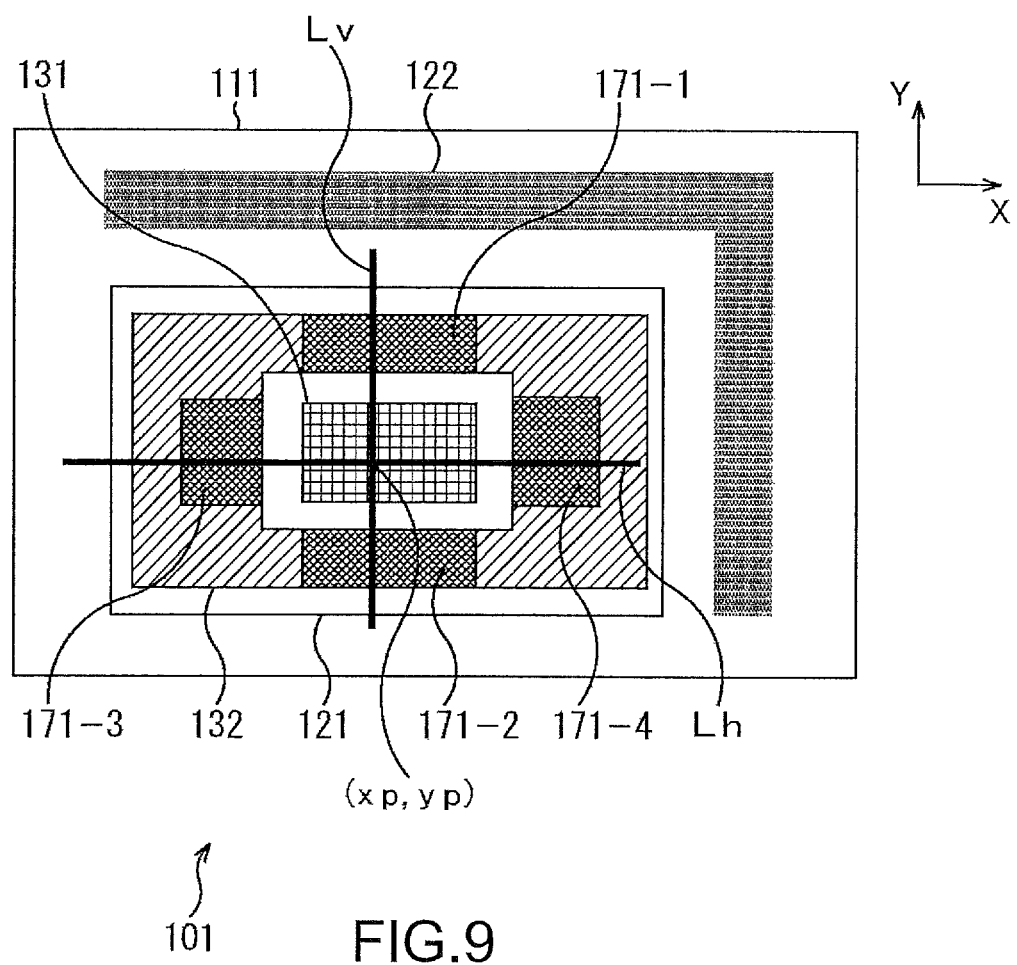
FIG. 9 is a diagram explaining a correction region.

FIG. 9 is a diagram explaining the correction region.

Correction regions 171-1 to 171-4 are positioned on upper, lower, left, and right portions of the ROI 131, respectively, in the light shielding region 132 and are closed regions each having a predetermined shape, in an example of FIG. 9, rectangular regions. The correction regions 171-1 and 171-2 are positioned on the upper and lower portions of the ROI 131, respectively, and positional coordinates in a row direction of the pixels correspond to positional coordinates in the row direction of the pixels of the ROI 131, respectively. That is, the correction regions 171-1 and 171-2 are arranged so as to sandwich the ROI 131 in a column direction. The correction regions 171-3 and 171-4 are positioned on the left and right portions of the ROI 131, respectively, and positional coordinates in the column direction of the pixels correspond to positional coordinates in the column direction of the pixels of the ROI 131, respectively. That is, the correction regions 171-3 and 171-4 are arranged so as to sandwich the ROI 131 in the row direction. It should be noted that, in the following, in the case where there is no need to distinguish the correction regions 171-1 to 171-4, those are referred to as the correction region 171 collectively.

In the case where one dimensional temperature distribution in the row direction or the column direction is not uniform on the light receiving surface 111 of the image sensor 101, the quantity of light with which the ROI 131 is irradiated is obtained on the basis of the output values of the pixels arranged on the same row or on the same column of the image sensor 101. That is, from the output values of the pixels arranged on a predetermined row or a predetermined column in the ROI 131, the offset or noise component value calculated on the basis of the output values of the pixels arranged on the same row or on the same column in the correction region 171 is subtracted, thereby obtaining the quantity of light with which the ROI 131 is irradiated.

For example, an axis parallel to the row direction of the image sensor 101 is set as an X axis, and an axis parallel to the column direction of the image sensor 101 is set as a Y axis. A pixel on which attention is focused as a measurement target of the quantity of light with which the ROI 131 is irradiated in the ROI 131 is referred to as an attention pixel. Here, coordinates of a crossing point of a line Lh in the X axis direction in FIG. 9 and a line Lv in the Y axis direction are represented as (xp, yp), and a pixel of the ROI 131, which is disposed on the crossing point, is set as the attention pixel.

In this case, if the temperature distribution is not uniform in the Y axis direction (i.e., in the column direction), in measuring the light quantity of the attention pixel of the ROI 131, a correction is carried out on the basis of output values of pixels arranged on an X coordinate xp, which is coincided with the X coordinate of the attention pixel in the correction regions 171-1 and 171-2, that is, pixels arranged on the line Lv shown in FIG. 9. For example, such a correction that an average value of the output values of the pixels arranged on the line Lv in the correction regions 171-1 and 171-2 is subtracted from the output value of the attention pixel in the ROI 131 is carried out. In this way, such a correction that an offset or noise component value calculated on the basis of the output values of the pixels arranged on the line Lv (X coordinate: xp) shown in FIG. 9 in the correction regions 171-1 and 171-2 is subtracted from the output value of the attention pixel in the ROI 131 is carried out, thereby obtaining the quantity of light with which the attention pixel of the ROI 131 is irradiated.

Further, for example, if the temperature distribution is not uniform in the X axis direction (i.e., in the row direction), in measuring the light quantity of the attention pixel of the ROI 131, a correction is carried out on the basis of output values of pixels arranged on a Y coordinate yp, which is coincided with the Y coordinate of the attention pixel in the correction regions 171-3 and 171-4, that is, pixels arranged on the line Lh shown in FIG. 9. For example, such a correction that an average value of the output values of the pixels arranged on the line Lh in the correction regions 171-3 and 171-4 is subtracted from the output value of the attention pixel in the ROI 131 is carried out. In this way, such a correction that an offset or noise component value calculated on the basis of the output values of the pixels arranged on the line Lh (Y coordinate: yp) shown in FIG. 9 in the correction regions 171-3 and 171-4 is subtracted from the output value of the attention pixel in the ROI 131 is carried out, thereby obtaining the quantity of light with which the attention pixel of the ROI 131 is irradiated.

By carrying out the correction of the light quantity with the use of the output values of the pixels in the row direction or in the column direction for each pixel in the ROI 131 as described above, on the light receiving surface 111 of the image sensor 101, even in the case where the temperature distribution is not uniform one dimensionally in the row direction or in the column direction, it is possible to measure the quantity of light with which the ROI 131 is irradiated with desirable accuracy.

Further, in the case where the temperature distribution on the light receiving surface 111 of the image sensor 101 is not uniform two-dimensionally, to correct the light quantity of the attention pixel of the ROI 131, the output values of the pixels arranged on the X coordinate xp in the correction regions 171-1 and 171-2 (i.e., pixels arranged on the line Lv shown in FIG. 9) and the output values of the pixels arranged on the Y coordinate yp in the correction regions 171-3 and 171-4 (i.e., pixels arranged on the line Lh shown in FIG. 9) are used in combination.

The correction of the light quantity with the use of the output values of the pixels in the row and column directions in combination is carried out for each pixel in the ROI 131 as described above, with the result that it is possible to measure the quantity of light with which the ROI 131 is irradiated with desirable accuracy, even in the case where the temperature distribution is not uniform in a two-dimensional direction on the light receiving surface 111 of the image sensor 101.

In other words, by arranging the correction region 171 on the basis of a direction in which a temperature gradient appears on the light receiving surface 111 of the image sensor 101, it is possible to measure the quantity of light with which the ROI 131 is irradiated with desirable accuracy, even in the case where the temperature distribution is not uniform on the light receiving surface 111 of the image sensor 101.

(Mounting of Image Sensor on Circuit Board)

Next, a description will be given on the case where the image sensor 101 is mounted on a circuit board 181.

In the case where the image sensor 101 is mounted on the circuit board 181, in the vicinity of the image sensor 101, various electric parts such as a resistance and an IC (Integrated Circuit) are arranged. The electric parts include an electric part that generates heat, such as a DC-DC converter (hereinafter, referred to as heat generation part). Further, due to a restriction or the like of a size or a circuit shape of the circuit board 181, the heat generation part may be disposed in the vicinity of the image sensor 101. Therefore, in this case, it is desirable that the heat generation part is disposed on such a position that the temperature distribution of the ROI 131 is uniform as much as possible.

Figure 10:
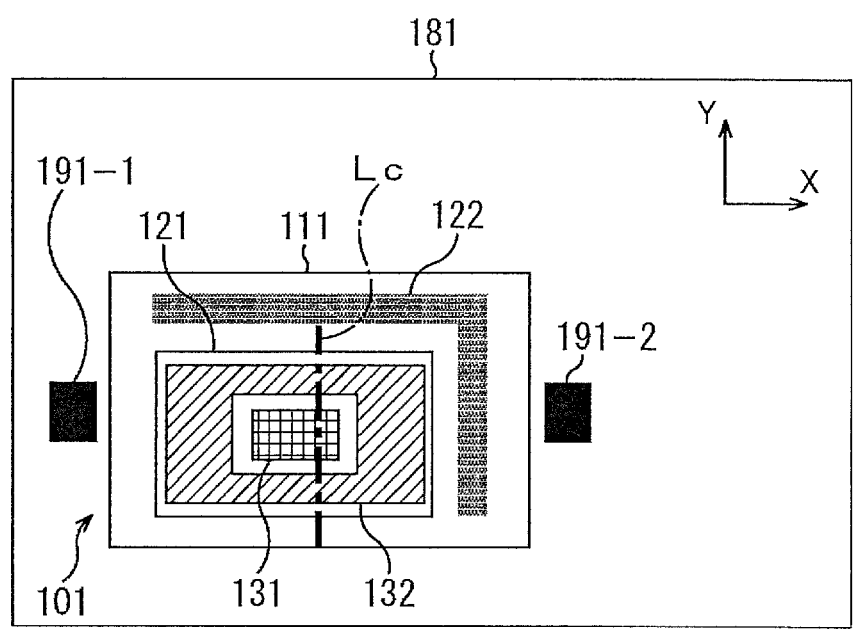
FIG. 10 is a top view showing an example of a circuit board on which a heat generation part is disposed in the vicinity of the image sensor.

FIG. 10 is a top view of the circuit board 181 on which the heat generation part is disposed in the vicinity of the image sensor 101.

In the example of FIG. 10, heat generation parts 191-1 and 191-2 are arranged symmetrically with respect to a center line of the light receiving surface 111 of the image sensor 101, which is indicated by the line Lc so as to make the temperature distribution on the light receiving surface 111 of the image sensor 101 uniform as much as possible. However, if the temperature distribution on the light receiving surface 111 of the image sensor 101 is not uniform even in the case where the heat generation parts 191-1 and 191-2 are arranged as described above, it is desirable to measure the quantity of light with which the ROI 131 is irradiated in the following manner.

In the case where the heat generation parts 191-1 and 191-2 are arranged on the positions shown in FIG. 10, the temperature distribution on the light receiving surface 111 of the image sensor 101 has such a tendency that the temperature gradient is weak in the Y axis direction and strong in the X axis direction. Therefore, in this case, in measuring the quantity of light with which the ROI 131 is irradiated, to correct the attention pixel in the ROI 131, it is desirable to use the output values of the pixels arranged on the X coordinate which is coincided with that of the attention pixel in the light shielding region 132.

For example, in the case where a pixel on the line Lc in the ROI 131 which is shown in FIG. 10 is set as the attention pixel, the output values of the pixels disposed on the same line Lc in the light shielding region 132 are used to correct the light quantity of the attention pixel.

By correcting the light quantity with the use of the output values of the pixels in the Y axis direction (i.e., column direction) for each pixel in the ROI 131, even in the case shown in FIG. 10, it is possible to measure the quantity of light with which the ROI 131 is irradiated with desirable accuracy.

It should be noted that the heat generation parts 191-1 and 191-2 may of course be arranged on the image sensor 101 symmetrically in a vertical direction. Also in this case, if the temperature distribution on the light receiving surface 111 of the image sensor 101 is not uniform, in measuring the quantity of light with which the ROI 131 is irradiated, to correct the attention pixel in the ROI 131, it is desirable to use the output values of the pixels arranged on the Y coordinate which is coincided with that of the attention pixel in the light shielding region 132.

Figure 11:
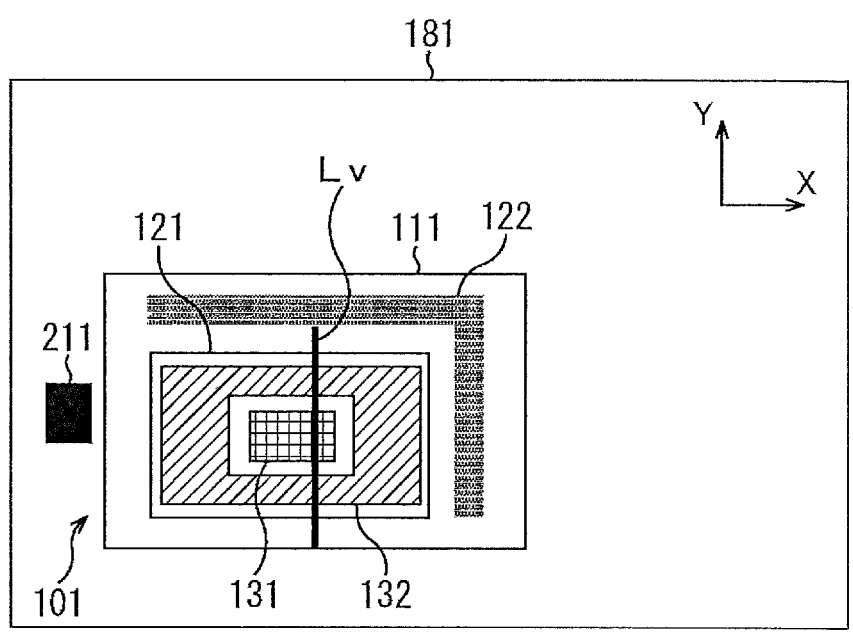
FIG. 11 is a top view showing another example of the circuit board on which the heat generation part is disposed in the vicinity of the image sensor.

Unlike the example of FIG. 10, in the case where it is difficult to dispose the heat generation part 191 on such a position that the temperature distribution on the light receiving surface 111 of the image sensor 101 is uniform, a heat generation part is disposed on a position as shown in FIG. 11.

FIG. 11 is a top view showing another example of the circuit board 181 on which a heat generation part is disposed in the vicinity of the image sensor 101.

In the example of FIG. 11, a heat generation part 211 is disposed substantially on the center of a left side so that the temperature distribution is generated in a direction along a predetermined side of the image sensor 101 (in this case, X axis direction). In this case, as the temperature distribution on the light receiving surface 111 of the image sensor 101, the temperature gradient is strong in the X axis direction and is uniform in the Y axis direction. Therefore, in this case, for the correction of the attention pixel in the ROI 131, it is desirable to use the output values of the pixels disposed on the X coordinate which is coincided with that of the attention pixel in the light shielding region 132.

For example, in the case where a pixel on the line Lv in the ROI 131 which is shown in FIG. 11 is set as the attention pixel, the output values of the pixels disposed on the same line Lv in the light shielding region 132 are used to correct the light quantity of the attention pixel.

It should be noted that the heat generation part 211 may of course be disposed so that the temperature distribution is generated in the Y axis direction of the image sensor 101. In this case, in the measurement of the quantity of light with which the ROI 131 is irradiated, to correct the attention pixel in the ROI 131, it is desirable to use the output values of the pixels arranged on the Y coordinate which is coincided with that of the attention pixel in the light shielding region 132.

As described above, in the case where the image sensor 101 is mounted on the circuit board 181, the heat generation part is disposed on such a position that the temperature distribution generated on the light receiving surface 111 of the image sensor 101 is taken into consideration. With this structure, it is possible to measure the quantity of light with which the pixels of the ROI 131 with more desirable accuracy with the use of the output values of the pixels of the light receiving region 132.

The present disclosure is not limited to the above embodiment, and the embodiment can be variously modified without departing from the gist of the present disclosure.

In the example described above, the image sensor 101 is formed as a part of the camera board 31 of the image pickup apparatus 12 which is a component of the microscope system 1 or is mounted on the circuit board attached. However, the structure of the image sensor is not limited to this, and the image sensor 101 of the present disclosure can be applied broadly to the case where the image sensor is used for the light quantity measurement.

It should be noted that the present disclosure can take the following configurations.

(1) An image sensor, including:
an effective pixel region formed of a pixel group which is irradiated with light; and
an optical black region formed of a pixel group which is shielded from light, in which
when the image sensor is used for a light quantity measurement, the effective pixel region is sectioned into a measurement region used for the light quantity measurement and a light shielding region which is used for a calculation of a value of one of an offset component and a noise component and is shielded from light.

(2) The image sensor according to Item (1), in which
the light shielding region is disposed on the basis of a direction in which a temperature gradient appears in the image sensor.

(3) The image sensor according to Item (1) or (2), in which
when the temperature gradient appears in a column direction of the image sensor, two light shielding regions are disposed with the measurement region sandwiched therebetween in the column direction.

(4) The image sensor according to any one of Items (1) to (3), in which
when the temperature gradient appears in a row direction of the image sensor, two light shielding regions are disposed with the measurement region sandwiched therebetween in the row direction.

(5) The image sensor according to any one of Items (1) to (4), in which
when the temperature gradient appears in a two-dimensional direction of the image sensor, two light shielding regions are disposed with the measurement region sandwiched therebetween in the column direction, and two light shielding regions are disposed with the measurement region sandwiched therebetween in the row direction.

(6) The image sensor according to any one of Items (1) to (5), in which
the effective pixel region is sectioned into a plurality of measurement regions.

(7) A light quantity measurement method of an apparatus configured to measure a light quantity by using an image sensor including
an effective pixel region formed of a pixel group which is irradiated with light, and
an optical black region formed of a pixel group which is shielded from light, in which
when the image sensor is used for a light quantity measurement, the effective pixel region is sectioned into a measurement region used for the light quantity measurement and a light shielding region which is used for a calculation of a value of one of an offset component and a noise component and is shielded from light,
the light quantity measurement method including:
obtaining output values of pixels of the measurement region by the apparatus;
calculating the value of the one of the offset component and the noise component by the apparatus on the basis of the obtained output values of the pixels of the light shielding region;
subtracting the calculated value of the one of the offset component and the noise component from the obtained output values of the pixels of the measurement region by the apparatus; and
outputting, as the light quantity, a value obtained by the subtracting by the apparatus.

(8) A microscope system, including:
an image pickup apparatus having an image sensor including an effective pixel region formed of a pixel group which is irradiated with light and an optical black region formed of a pixel group which is shielded from light, in which when the image sensor is used for a light quantity measurement, the effective pixel region is sectioned into a measurement region used for the light quantity measurement and a light shielding region which is used for a calculation of a value of one of an offset component and a noise component and is shielded from light;

a microscope connected to the image pickup apparatus and having a stage on which a sample is placed and an optical system configured to form an enlarged image of the sample on the image sensor; and an information processing apparatus configured to calculate a light quantity from an output of the image pickup apparatus.

The present disclosure contains subject matter related to that disclosed in Japanese Priority Patent Application JP 2011-190381 filed in the Japan Patent Office on Sep. 1, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image sensor, comprising:
    an effective pixel region formed of a pixel group which is irradiated with light; and
    an optical black region formed of a pixel group which is shielded from light, wherein
    when the image sensor is used for a light quantity measurement, the effective pixel region is sectioned into a measurement region used for the light quantity measurement and a light shielding region which is used for a calculation of a value of one of an offset component and a noise component and is shielded from light, wherein a position at which the light shielding region is disposed in the effective pixel region is changeable.

2. The image sensor according to claim 1, wherein the light shielding region is disposed on the basis of a direction in which a temperature gradient appears in the image sensor.

3. The image sensor according to claim 2, wherein when the temperature gradient appears in a row direction of the image sensor, two light shielding regions are disposed with the measurement region sandwiched therebetween in the row direction.

4. The image sensor according to claim 2, wherein when the temperature gradient appears in a two-dimensional direction of the image sensor, two light shielding regions are disposed with the measurement region sandwiched therebetween in a column direction, and two light shielding regions are disposed with the measurement region sandwiched therebetween in a row direction.

5. The image sensor according to claim 1, wherein the effective pixel region is sectioned into a plurality of measurement regions.

6. The image sensor according to claim 1, wherein the light shielding region is shielded from the light by bringing a light-shielding film into contact with a cover glass attached to the image sensor.

7. The image sensor according to claim 6, wherein the position at which the light shielding region is disposed in the effective pixel region is changed by changing the position of the light-shielding film.

8. An image sensor, comprising:
    an effective pixel region formed of a pixel group which is irradiated with light; and
    an optical black region formed of a pixel group which is shielded from light, wherein
    when the image sensor is used for a light quantity measurement, the effective pixel region is sectioned into a measurement region used for the light quantity measurement and a light shielding region which is used for a calculation of a value of one of an offset component and a noise component and is shielded from light, wherein
    the light shielding region is disposed on the basis of a direction in which a temperature gradient appears in the image sensor, and wherein
    when the temperature gradient appears in a column direction of the image sensor, two light shielding regions are disposed with the measurement region sandwiched therebetween in the column direction.

9. A light quantity measurement method of an apparatus configured to measure a light quantity by using an image sensor including
    an effective pixel region formed of a pixel group which is irradiated with light, and
    an optical black region formed of a pixel group which is shielded from light, in which when the image sensor is used for a light quantity measurement, the effective pixel region is sectioned into a measurement region used for the light quantity measurement and a light shielding region which is used for a calculation of a value of one of an offset component and a noise component and is shielded from light,
    the light quantity measurement method comprising:
        obtaining output values of pixels of the measurement region by the apparatus;
        calculating the value of the one of the offset component and the noise component by the apparatus on the basis of the obtained output values of the pixels of the light shielding region;
        subtracting the calculated value of the one of the offset component and the noise component from the obtained output values of the pixels of the measurement region by the apparatus; and
        outputting, as the light quantity, a value obtained by the subtracting by the apparatus.

10. A microscope system, comprising:
    an image pickup apparatus having an image sensor including an effective pixel region formed of a pixel group which is irradiated with light and an optical black region formed of a pixel group which is shielded from light, in which when the image sensor is used for a light quantity measurement, the effective pixel region is sectioned into a measurement region used for the light quantity measurement and a light shielding region which is used for a calculation of a value of one of an offset component and a noise component and is shielded from light, wherein a position at which the light shielding region is disposed in the effective pixel region is changeable;
    a microscope connected to the image pickup apparatus and having a stage on which a sample is placed and an optical system configured to form an enlarged image of the sample on the image sensor; and
    an information processing apparatus configured to calculate a light quantity from an output of the image pickup apparatus.

* * * * *